(12) United States Patent
Mangold et al.

(10) Patent No.: US 8,547,157 B1
(45) Date of Patent: Oct. 1, 2013

(54) RADIO FREQUENCY SWITCHING DEVICE WITH FAST TRANSIENT RESPONSE TIME

(75) Inventors: Tobias Mangold, Weilheim (DE); Andreas Weisgerber, Munich (DE)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 13/455,998

(22) Filed: Apr. 25, 2012

(51) Int. Cl.
*H03L 5/00* (2006.01)

(52) U.S. Cl.
USPC .......................................... 327/308; 333/81 R (58) Field of Classification Search
USPC ................. 327/374–376, 308, 306; 333/258, 333/81 R
See application file for complete search history.

(56) References Cited

U.S. PATENT DOCUMENTS

| | | | |
|---|---|---|---|
| 3,506,851 A * | 4/1970 | Dierking et al. | 326/88 |
| 4,890,077 A * | 12/1989 | Sun | 333/81 A |
| 5,777,530 A * | 7/1998 | Nakatuka | 333/104 |
| 6,141,541 A | 10/2000 | Midya | |
| 6,349,216 B1 | 2/2002 | Alberth | |
| 6,349,219 B1 | 2/2002 | Hochwald | |
| 6,438,360 B1 | 8/2002 | Alberth | |
| 7,868,683 B2 * | 1/2011 | Ilkov | 327/374 |
| 8,339,180 B2 * | 12/2012 | Lee | 327/427 |

* cited by examiner

*Primary Examiner* — Dinh T. Le
(74) *Attorney, Agent, or Firm* — Schwabe Williamson & Wyatt (57) ABSTRACT

Embodiments provide a radio frequency (RF) switching apparatus including an RF switching device configured to receive an RF input signal and to pass an RF output signal if the RF switching device is activated. The RF switching apparatus may include a control terminal to receive a control signal to activate the RF switching device. A gate resistor may be coupled between the control terminal and a gate terminal of the RF switching device. A helper circuit may be coupled in parallel with the gate resistor. The helper circuit may be configured to provide a temporary conductive path between the control terminal and the gate terminal in response to a state transition of the control signal. The helper circuit may provide an open circuit between the control terminal and the gate terminal during a steady state of the control signal between state transitions.

18 Claims, 4 Drawing Sheets

RADIO FREQUENCY SWITCHING DEVICE WITH FAST TRANSIENT RESPONSE TIME

FIELD

Embodiments of the present disclosure relate generally to the field of circuits, and more particularly to radio frequency switching devices with fast transient response times.

BACKGROUND

Radio frequency (RF) switching devices are used in many applications, such as in wireless communication systems, to selectively pass an RF signal. For switching devices that include a field-effect transistor (FET), the transient response of the switching device is typically related to the charging time of the FET's gate capacitance. For high-power RF switching devices, large FETs are often required to reduce insertion loss and provide sufficient power handling. Accordingly, the FETs typically have large gate capacitance values. Additionally, gate terminations with a high impedance are often used to prevent RF signal leakage and insertion loss. Both of these factors increase the resistance-capacitance (RC) time constant for charging and/or discharging the gate capacitance during a state transition, thereby lengthening the transient response of the RF switching device.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Figure 1:
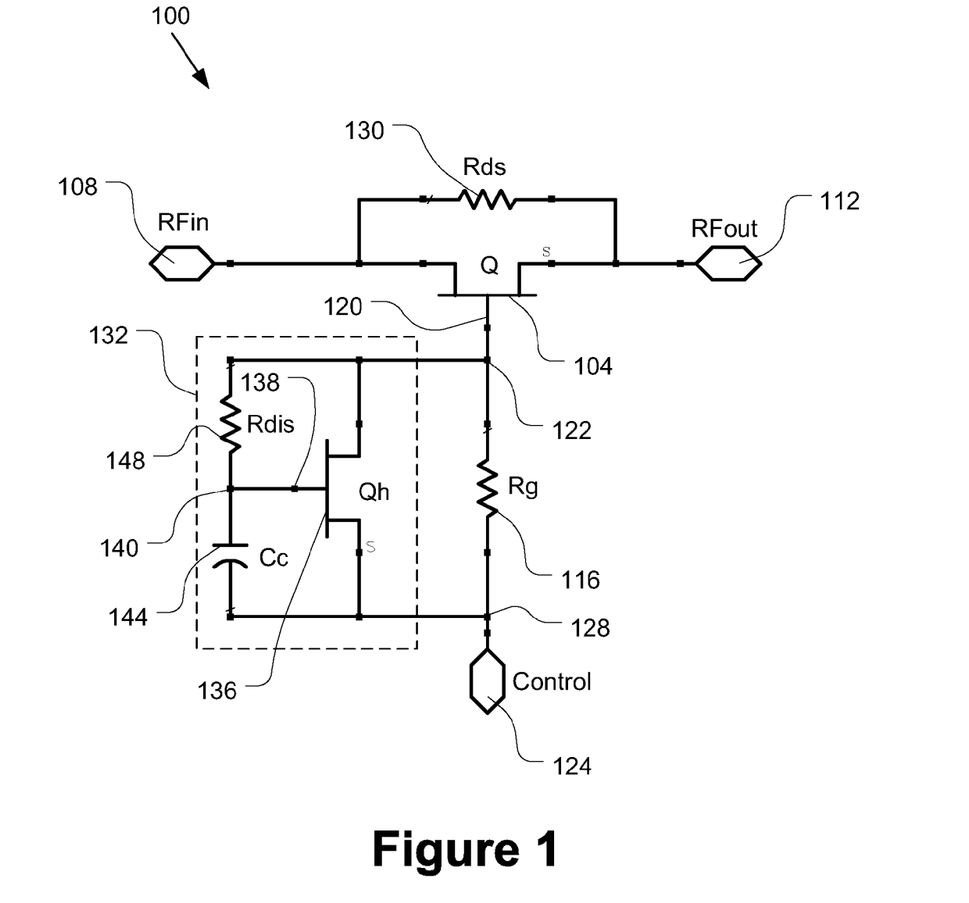
FIG. 1 illustrates a circuit diagram of a radio frequency (RF) switching device in accordance with various embodiments.

FIG. 1 illustrates a radio frequency (RF) switching circuit 100 in accordance with various embodiments. Circuit 100 may include an RF switching device 104 that may receive an RF input signal RFin at an input terminal 108 and pass an RF output signal RFout at an output terminal 112 if the RF switching device 104 is activated. The circuit 100 may further include a gate resistor 116, Rg, coupled between a gate terminal 120 of the RF switching device 104 (e.g., at an inner node 122) and a control terminal 124 (e.g., at an outer node 128). The control terminal 124 may receive a control signal to activate and/or deactivate the RF switching device 104.

In some embodiments, the control signal may include a step function and/or a square wave that transitions between a first logic state (e.g., a logic zero) and a second logic state (e.g., a logic one) to activate and/or deactivate the RF switching device 104. The RF switching device 104 may be activated if the control signal transitions from the first logic state to the second logic state, and may be deactivated if the control signal transitions from the second logic state to the first logic state.

RF switching device 104 may include any suitable structure, such as one or more transistors. For example, RF switching device 104 may include one or more field-effect transistors (FETs), such as FET Q shown in FIG. 1. The circuit 100 may further include a resistor 130, Rds, coupled between a drain terminal and a source terminal of the RF switching device 104 to provide biasing for RF switching device 104.

In various embodiments, the circuit 100 may further include a helper circuit 132 coupled in parallel with the gate resistor 116 to temporarily provide a conductive path between the control terminal 124 and the gate terminal 120 in response to a state transition of the control signal (e.g., if the control signal transitions from the first logic state to the second logic state). The helper circuit 132 may provide an open circuit (e.g., a large impedance) between the control terminal 124 and the gate terminal 120 during a steady state of the control signal between state transitions. Thus, the helper circuit 132 may provide a fast transient response for the RF switching device 104, while providing RF signal isolation between the gate terminal 120 and the control terminal 124 during the steady state of the control signal.

In various embodiments, the helper circuit 132 may include a helper switching device 136, Qh, coupled in parallel with the gate resistor 116. For example, a drain terminal of the helper switching device 136 may be coupled with the inner node 122 and a source terminal of the helper switching device 136 may be coupled with the outer node 128. A helper gate terminal 138 of the helper switching device 136 may be coupled with a helper node 140. The helper circuit 132 may further include a coupling capacitor 144, Cc, coupled between the helper gate terminal 138 and the control terminal 124. The helper circuit 132 may further include a discharge resistor 148, Rdis, coupled between the helper gate terminal 138 and the gate terminal 120 of the RF switching device 104.

The helper switching device 136 may include one or more transistors. In some embodiments, the helper switching device 136 may include an enhancement mode FET. The helper switching device 136 may have dimensions that are smaller than corresponding dimensions of the RF switching device 104. For example, in some embodiments, the dimensions of the helper switching device 136 may be at least 10 times smaller than the corresponding dimensions of the RF switching device 104.

During the steady state of the control signal, between transitions, the gate charge at gate terminal 120 of RF switching device 104 may be constant. The inner node 122, outer node 128 and helper node 140 may all be at an equal potential (e.g., the voltage of the control signal applied at control terminal 124). Accordingly, no current may flow through gate resistor 116 or discharge resistor 148. The helper switching device 136 may be off since there is no effective voltage (e.g., voltage drop) applied between the gate and drain terminals and/or between the gate and source terminals of the helper switching device 136. The helper switching device 136 may thus provide an open circuit (e.g., a high impedance) between the drain and source nodes of the helper switching device 136. Therefore, the helper switching device 136 may provide RF signal isolation between the RF switching device 104 and the control terminal 124 during the steady state of the control signal.

If a state transition of the control signal occurs (e.g., the control signal transitions from the first logic state to the second logic state or from the second logic state to the first logic state), the voltage at control terminal 124 may change. The voltage at the control terminal 124 may be enforced by an external source with a low impedance compared with the gate resistor 116. The voltage at the inner node 122 may not follow the voltage at the control terminal 124 immediately due to the voltage drop caused at gate resistor 116 by the current required to charge and/or discharge the gate capacitance of the RF switching device 104. Without the helper circuit 132, the response time for charging and/or discharging the gate capacitance of the RF switching device 104 would be determined by a resistance-capacitance (RC) time constant derived from the gate capacitance of the RF switching device 104 and the resistance of gate resistor 116.

In various embodiments, the helper circuit 132 may provide a faster transient response for the RF switching device 104 in response to a state transition of the control signal. The capacitive coupling provided by coupling capacitor 144 may enable a fast propagation of the transition in voltage of the control signal to the helper node 140, resulting in an effective voltage drop between the helper node 140 and the inner node 122. This voltage drop may cause the helper switching device 136 to turn on, thereby providing a low impedance conductive path between the control terminal 124 and the inner node 122. Thus, the inner node 122 may arrive at the voltage level of the control terminal 124 much faster. This, in turn, may reduce the transient response time of the RF switching device 104.

Discharge resistor 148 may cause the helper switching device 136 to turn off once the voltage at inner node 122 has reached the voltage at outer node 128 and the charging current (s) have decayed. Thus, the helper switching device 136 may automatically turn off once the state transition is complete, thereby providing an open circuit during the subsequent steady state.

In various embodiments, if the control signal transitions from the first logic state to the second logic state, the gate terminal 120 of RF switching device 104 may charge via the conductive path provided by the helper circuit 132, thereby activating the RF switching device 104. In the activated state, the RF switching device 104 may pass RFin to the output terminal 112 as RF out.

Conversely, if the control signal transitions from the second logic state to the first logic state, the gate terminal 120 of RF switching device 104 may discharge via the conductive path provided by the helper circuit 132, thereby deactivating the RF switching device 104. In the deactivated state, the RF switching device 104 may prevent RFin from passing to the output terminal 112.

In some embodiments, the circuit 100 may be used for "hot-switching" an RF signal. That is, the circuit 100 may be activated and/or deactivated while RF power is applied to RF switching device 104 (e.g., while RF switching device 104 is receiving an RFin signal). The fast transient response of RF switching device 104 may prevent/reduce insertion loss of the RF signals due to switching, thereby improving the performance of circuit 100 for hot-switching of RF signals.

In some embodiments, the discharge time constant of the helper switching device 136 may be matched to the accelerated time constant of the RF switching device 104. The acceleration of the time constant of the RF switching device 104 may be a result of the assistance provided by the helper switching device 136. Matching the discharge time constant to the accelerated time constant may ensure that the helper switching device 136 turns off in sync with the end of the state transition of the RF switching device 104. Accordingly, the resistance value of discharge resistor 148 may be selected based on the size of the helper switching device 136.

Figure 2:
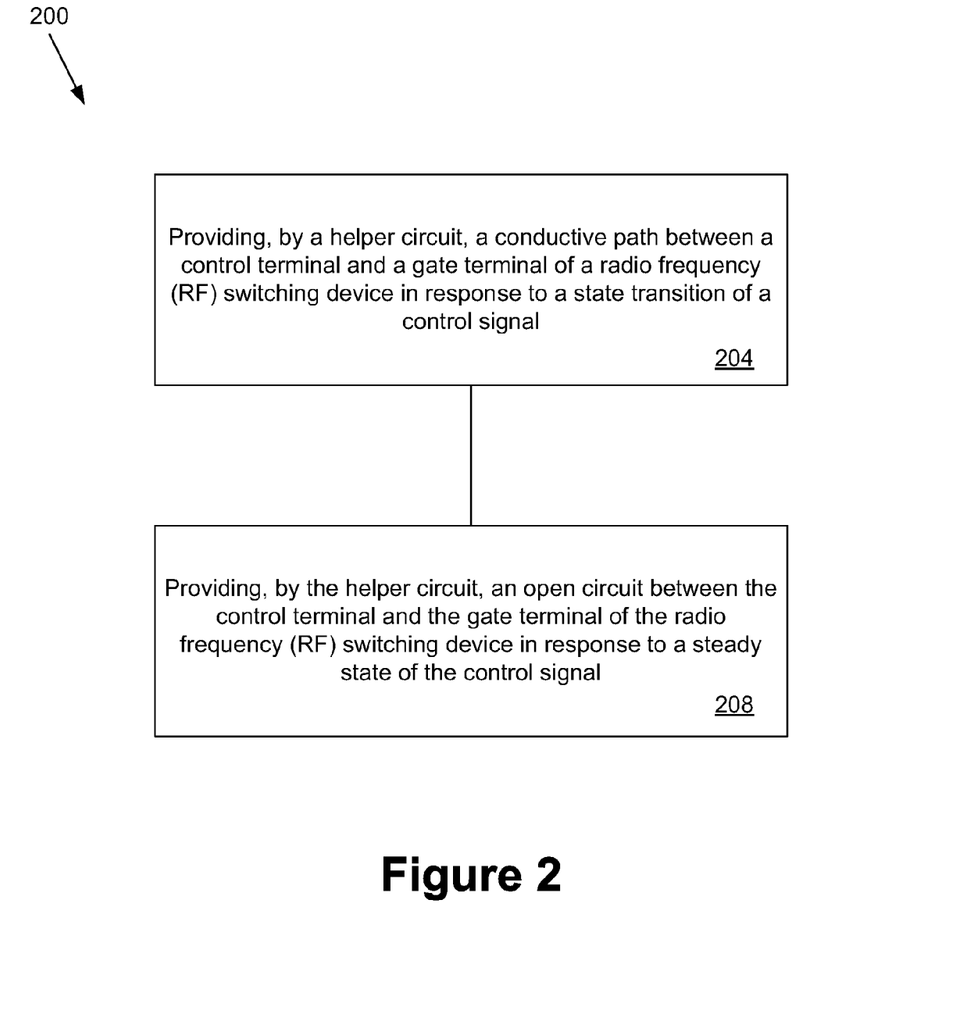
FIG. 2 illustrates a flow chart of a method for providing an RF switching device with a fast transient response in accordance with various embodiments.

FIG. 2 shows a flow chart of a method 200 of providing a fast transient response time for an RF switching device (e.g., RF switching device 104) in accordance with various embodiments. At block 204, a conductive path may be provided, by a helper circuit, between a control terminal and a gate terminal of the RF switching device in response to a state transition of a control signal received at the control terminal. The control signal may be used to activate and/or deactivate the RF switching device. The gate terminal may charge via the conductive path provided by the helper circuit to activate the RF switching device, and may discharge via the conductive path to deactivate the RF switching device.

At block 208, the helper circuit may provide an open circuit between the control terminal and the gate terminal of the RF switching device in response to a steady state of the control signal (e.g., between state transitions). The open circuit may be presented as a high impedance. The open circuit may prevent/reduce leakage of an RFin signal received by the RF switching device through the helper circuit.

Figure 3:
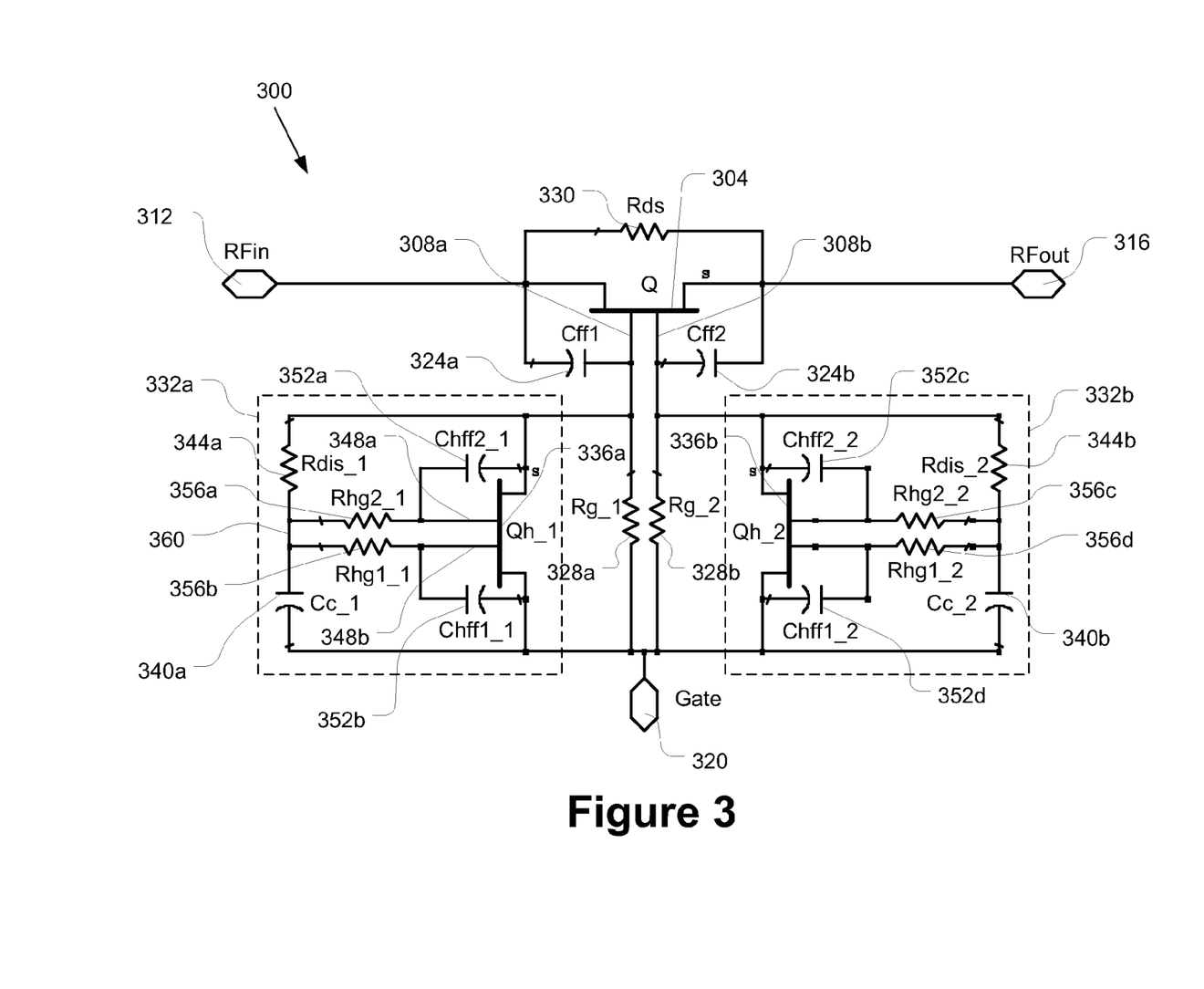
FIG. 3 illustrates a circuit diagram of an alternative configuration of an RF switching device in accordance with various embodiments.

FIG. 3 illustrates an alternative embodiment of an RF switching circuit 300 that may be particularly suited for high power applications (e.g., for RFin signals having higher power). Circuit 300 may include a multi-gate RF switching device 304, Q, having a plurality of gate terminals 308a-b (e.g., a first gate terminal 308a and a second gate terminal 308b). Although RF switching device 304 is shown with two gate terminals 308a-b, in other embodiments RF switching device 304 may include three or more gate terminals. Circuit 300 may receive an RF input signal RFin at an input terminal 312 and may pass an RF output signal RFout to an output terminal 316 if the RF switching device 304 is activated.

Circuit 300 may receive a control signal at a control terminal 320 to activate and/or deactivate the RF switching device 304.

In various embodiments, circuit 300 may further include a feed-forward capacitor 324a, Cff1, coupled between a drain terminal of RF switching device 304 and the first gate terminal 308a and another feed-forward capacitor 324b, Cff2, coupled between a source terminal of RF switching device 304 and the second gate terminal 308b. The feed-forward capacitors 324a-b may allow RF switching device to handle RFin signals of higher power. In embodiments in which the RF switching device 304 includes more than two gates, feed-forward capacitors 324a-b may only be included on the two outer-most gates.

In various embodiments, circuit 300 may further include a first gate resistor 328a, Rg_1, coupled between the first gate terminal 308a and the control terminal 320 and a second gate resistor 328b, Rg_2, coupled between the second gate terminal 308b and the control terminal 320. In some embodiments, circuit 300 may include a resistor 330, Rds, coupled between the source terminal and the drain terminal of RF switching device 304. Other embodiments may not include resistor 330 and/or may include a different structure to provide biasing for RF switching device 304 (e.g., a resonant parallel inductor and capacitor).

In various embodiments, circuit 300 may further include a first helper circuit 332a and a second helper circuit 332b. The first helper circuit 332a may be coupled in parallel with the first gate resistor 328a and the second helper circuit 332b may be coupled in parallel with the second gate resistor 328b. The first helper circuit 332a may include a multi-gate helper switching device 336a, Qh_1, a coupling capacitor 340a, Cc_1, and a discharge resistor 344a, Rdis_1. The helper switching device 336a may be an enhancement mode FET, which may be effectively self-isolating and non-complementary in some embodiments. Helper switching device 336a may include a pair of helper gate terminals 348a and 348b.

In some embodiments, the first helper circuit 332a may further include feed-forward capacitors 352a-b, Chff2_1 and Chff1_1. Feed-forward capacitor 352a may be coupled between helper gate terminal 348a and a source terminal of the helper switching device 336a, and feed-forward capacitor 352b may be coupled between helper gate terminal 348b and a drain terminal of the helper switching device 336a. In these embodiments, helper gate resistors 356a-b, Rhg2_1 and Rhg1_1, may be included at respective helper gate terminals 348a-b to prevent RF signal leakage through feed-forward capacitors 352a-b and/or coupling capacitor 340a. Additionally, helper gate resistors 356a-b may reduce RF voltage swing between the drain and gate, respectively, of the RF switching device 336a. Helper gate resistors 356a-b, discharge resistor 344a and coupling capacitor 340a may be coupled with one another at a helper node 360.

The second helper circuit 332b may include a similar arrangement of components as first helper circuit 332a and operate in a similar manner. Second helper circuit 332b may include a helper switching device 336b, Qh_2, a coupling capacitor 340b, Cc_2, a discharge resistor 344b, Rdis_2, feed-forward capacitors 352c-d, Chff2_2 and Chff1_2, and helper gate resistors 356c-d, Rhg2_2 and Rhg1_2.

The circuit 300 may be used for applications in which RFin may have a high power (e.g., RF voltage swing above about 3 Volts). In this case, the RF voltage swing of RFin may exceed the threshold voltages of the RF switching device 304 and/or helper switching devices 336a-b. Accordingly, RF switching device 304 and/or helper switching devices 336a-b may be multi-gate devices as shown in FIG. 3. Additionally, in some embodiments, the circuit 300 may include feed-forward capacitors 324a-b and/or 352a-d to facilitate higher power handling for the respective switching device 304, 336a, and/or 336b.

As discussed above, helper gate resistors 356a-d may be included to facilitate high power operation by preventing/reducing RF voltage swing between gate and source and/or gate and drain of the helper switching devices 336a-b. The resistance of helper gate resistors 356a-d may slow down activation of the helper switching device (e.g., in response to a state transition of the control signal). However, the helper switching devices 336a-b may be smaller than the RF switching device 304, and the helper gate resistors 356a-d may have a lower resistance than the first and second gate resistors 328a-b. Accordingly, the RC charging time constant of helper switching devices 336a-b may be smaller than the RC charging time constant of the RF switching device 304, thereby providing an improved (faster) transient response for RF switching device 304. For example, in some embodiments, the time constant of helper switching devices 336a-b may be about ten times faster than the time constant of the RF switching device 304.

Figure 4:
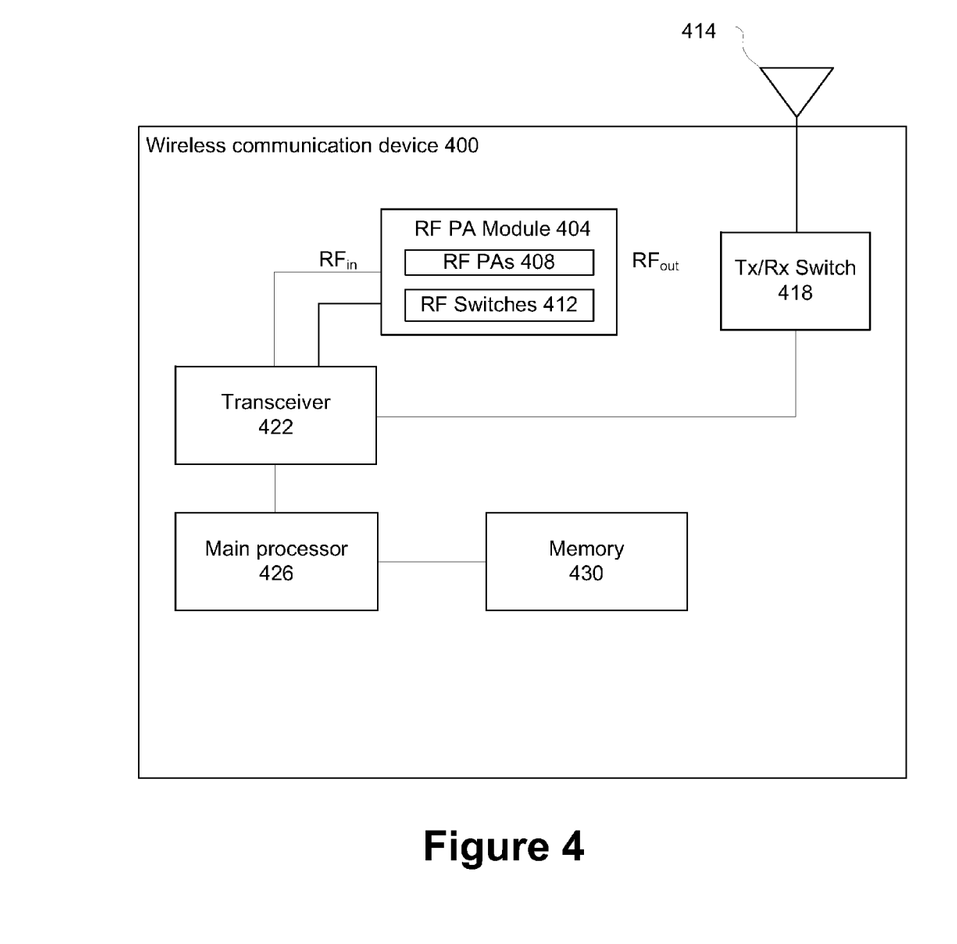
FIG. 4 is a block diagram of an exemplary wireless communication device in accordance with various embodiments.

A block diagram of an exemplary wireless communication device 400 is illustrated in FIG. 4 in accordance with some embodiments. Wireless communication device 400 may have an RF power amplifier (PA) module 404 including one or more RF PAs 408. RF PA module 404 may further include one or more RF switches 412 coupled with one or more of the RF PA(s) 408. The RF switches 412 may be similar to circuits 100 and/or 300. Additionally, or alternatively, the RF switches 412 may be configured to carry out method 200.

In addition to the RF PA module 404, the wireless communication device 400 may have an antenna structure 414, a Tx/Rx switch 418, a transceiver 422, a main processor 426, and a memory 430 coupled with each other at least as shown. While the wireless communication device 400 is shown with transmitting and receiving capabilities, other embodiments may include devices with only transmitting or only receiving capabilities. While RF switches 412 are shown as included in RF PA module 404, in other embodiments, RF switches 412 may be included in other components of the wireless communication device 400, such as Tx/Rx switch 418 and/or transceiver 422, in addition to or instead of RF PA module 404.

In various embodiments, the wireless communication device 400 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

The main processor 426 may execute a basic operating system program, stored in the memory 430, in order to control the overall operation of the wireless communication device 400. For example, the main processor 426 may control the reception of signals and the transmission of signals by transceiver 422. The main processor 426 may be capable of executing other processes and programs resident in the memory 430 and may move data into or out of memory 430, as desired by an executing process.

The transceiver 422 may receive outgoing data (e.g., voice data, web data, e-mail, signaling data, etc.) from the main processor 426, may generate the $RF_{in}$ signal(s) to represent the outgoing data, and provide the $RF_{in}$ signal(s) to the RF PA module 404. The transceiver 422 may also control the RF PA module 404 to operate in selected bands and in either fullpower or backoff-power modes. In some embodiments, the transceiver 422 may generate the $RF_{in}$ signal(s) using OFDM modulation.

The RF PA module 404 may amplify the $RF_{in}$ signal(s) to provide $RF_{out}$ signal(s) as described herein. The $RF_{out}$ signal (s) may be forwarded to the Tx/Rx switch 418 and then to the antenna structure 414 for an over-the-air (OTA) transmission. In some embodiments, Tx/Rx switch 418 may include a duplexer. In a similar manner, the transceiver 422 may receive an incoming OTA signal from the antenna structure 414 through the Tx/Rx switch 418. The transceiver 422 may process and send the incoming signal to the main processor 426 for further processing.

The one or more RF switches 412 may be used to selectively pass RF signal(s) (e.g., $RF_{in}$ signal(s) and/or $RF_{out}$ signal(s)) to, from, and/or within components of wireless communication device 400. In some embodiments, RF switches 412 may be used for "hot-switching" RF signal(s) (e.g., switching while RF power is applied to RF switch 412). In one embodiment, an RF switch 412 may receive the amplified $RF_{out}$ signal and selectively pass the amplified $RF_{out}$ signal to a shunt capacitor if the RF switch 412 is activated.

In various embodiments, the antenna structure 414 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 400 is given by way of example and that, for simplicity and clarity, only so much of the construction and operation of the wireless communication device 400 as is necessary for an understanding of the embodiments is shown and described. Various embodiments contemplate any suitable component or combination of components performing any suitable tasks in association with wireless communication device 400, according to particular needs. Moreover, it is understood that the wireless communication device 400 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
 a radio frequency (RF) switching device having a gate terminal, the RF switching device configured to receive an RF input signal and to pass an RF output signal if the RF switching device is activated;
 a gate resistor coupled between the gate terminal and a control terminal, the control terminal configured to receive a control signal to activate the RF switching device; and
 a helper circuit coupled in parallel with the gate resistor, the helper circuit configured to provide a temporary conductive path between the control terminal and the gate terminal in response to a state transition of the control signal, wherein the helper circuit includes:
 a helper switching device coupled in parallel with the gate resistor, the helper switching device having a helper gate terminal;
 a coupling capacitor coupled between the helper gate terminal and the control terminal to turn on the helper switching device in response to the state transition of the control signal; and
 a discharge resistor coupled between the helper gate terminal and the gate terminal of the RF switching device to turn off the helper switching device when a voltage at the gate terminal is equal to a voltage at the control terminal.

2. The circuit of claim 1, wherein the helper circuit comprises an open circuit between the control terminal and the gate terminal of the RF switching device during a steady state of the control signal between state transitions.

3. The circuit of claim 1, wherein the RF switching device and the helper switching device comprise field-effect transistors.

4. The circuit of claim 1, wherein dimensions of the helper switching device are smaller than corresponding dimensions of the RF switching device by a factor of ten or more.

5. The circuit of claim 1, wherein the helper switching device is an enhancement type device.

6. The circuit of claim 1, wherein the gate terminal is a first gate terminal, the gate resistor is a first gate resistor, and the helper circuit is a first helper circuit, and wherein the RF switching device further includes a second gate terminal, and wherein the circuit further includes:
 a second gate resistor coupled between the second gate terminal and the control terminal; and
 a second helper circuit coupled in parallel with the second gate resistor, the second helper circuit configured to provide a conductive path between the control terminal and the second gate terminal in response to the state transition of the control signal.

7. The circuit of claim 6, wherein the helper switching device of the first helper circuit is a first helper switching device, wherein the helper gate terminal of the first helper switching device is a first helper gate terminal, wherein the first helper switching device further includes a second helper gate terminal, and wherein the first helper circuit further includes:
 a first helper gate resistor coupled between the first helper gate terminal and a first node;
 a second helper gate resistor coupled between the second helper gate terminal and the first node;
 wherein the coupling capacitor is coupled between the first node and the control terminal; and
 wherein the discharge resistor is coupled between the first node and the first gate terminal of the RF switching device.

8. The circuit of claim 7, wherein the first helper switching device further includes a helper drain terminal and a helper source terminal, and wherein the first helper circuit further includes a first feed-forward capacitor coupled between the first helper gate terminal and the helper drain terminal and a second feed-forward capacitor coupled between the second helper gate terminal and the helper source terminal.

9. A radio frequency (RF) switching apparatus, comprising:
 an RF transistor having a gate terminal, a drain terminal and a source terminal, the RF transistor configured to receive an RF input signal at the drain terminal and to pass an RF output signal to the source terminal if the RF transistor is activated;

a gate resistor coupled between the gate terminal and a control terminal, the control terminal configured to receive a control signal to activate the RF transistor;

a helper transistor coupled in parallel with the gate resistor, the helper transistor having a helper gate terminal, a helper drain terminal, and a helper source terminal;

a coupling capacitor coupled between the helper gate terminal and the control terminal; and a discharge resistor coupled between the helper gate terminal and the gate terminal of the RF transistor wherein the coupling capacitor is configured to turn on the helper transistor in response to a state transition of the control signal to provide a conductive path between the control terminal and the gate terminal of the RF transistor; and wherein the discharge resistor is configured to turn off the helper transistor when a voltage at the gate terminal is equal to a voltage at the control terminal.

10. The RF switching apparatus of claim 9, wherein the helper transistor comprises an open circuit between the control terminal and the gate terminal of the RF transistor during a steady state of the control signal between state transitions.

11. The RF switching apparatus of claim 9, wherein the helper gate terminal is a first helper gate terminal, wherein the helper transistor further comprises a second helper gate terminal, and wherein the apparatus further includes:

a first helper gate resistor coupled with the first helper gate terminal; and a second helper gate resistor coupled with the second helper gate terminal.

12. The RF switching apparatus of claim 11, wherein the helper transistor, the coupling capacitor, the discharge resistor, and the first and second helper gate resistors are included in a first helper circuit, wherein the gate terminal is a first gate terminal, the gate resistor is a first gate resistor, and the RF transistor further comprises a second gate terminal, and wherein the apparatus further comprises:

a second gate resistor coupled between the second gate terminal and the control terminal; and a second helper circuit coupled in parallel with the second gate resistor.

13. The RF switching apparatus of claim 11, wherein the RF transistor further includes a helper drain terminal and a helper source terminal, and wherein the apparatus further comprises a first feed-forward capacitor coupled between the first helper gate terminal and the helper drain terminal and a second feed-forward capacitor coupled between the second helper gate terminal and the helper source terminal.

14. The RF switching apparatus of claim 9, wherein the helper transistor is an enhancement type field-effect transistor.

15. A system, comprising:

a radio frequency (RF) power amplifier configured to amplify an RF signal; and an RF switching module coupled with the RF power amplifier, the RF switching module including:

a radio frequency (RF) transistor having a gate terminal, an input terminal, and an output terminal, the RF transistor configured to receive the RF signal at the input terminal and to selectively pass the RF signal to the output terminal if the RF transistor is activated;

a control terminal configured to receive a control signal to activate the RF transistor;

a gate resistor coupled between the gate terminal and the control terminal; and a helper circuit coupled in parallel with the gate resistor, the helper circuit configured to provide a temporary conductive path between the control terminal and the gate terminal in response to a state transition of the control signal, wherein the helper circuit includes:

a helper switching device coupled in parallel with the gate resistor, the helper switching device having a helper gate terminal;

a coupling capacitor coupled between the helper gate terminal and the control terminal to turn on the helper switching device in response to the state transition of the control signal; and a discharge resistor coupled between the helper gate terminal and the gate terminal of the RF switching device to turn off the helper switching device when a voltage at the gate terminal is equal to a voltage at the control terminal.

16. The system of claim 15, wherein the gate terminal is a first gate terminal, the gate resistor is a first gate resistor, and the helper circuit is a first helper circuit, wherein the RF transistor further includes a second gate terminal, and wherein the system further includes:

a second gate resistor coupled between the second gate terminal and the control terminal; and a second helper circuit coupled in parallel with the second gate resistor, the second helper circuit configured to provide a conductive path between the control terminal and the second gate terminal in response to the state transition of the control signal.

17. The circuit of claim 16, wherein the helper gate terminal is a first helper gate terminal, wherein the helper transistor further includes a second helper gate terminal, and wherein the first helper circuit further includes:

a first helper gate resistor coupled with the first helper gate terminal; and a second helper gate resistor coupled with the second helper gate terminal.

18. The circuit of claim 16, further comprising a shunt capacitor coupled with the output terminal of the RF switching transistor, wherein RF transistor is configured to receive the amplified RF signal at the input terminal and to pass the amplified RF signal to the shunt capacitor if the RF transistor is activated.

* * * * *

UNITED STATES PATENT AND TRADEMARK OFFICE
CERTIFICATE OF CORRECTION

PATENT NO.         : 8,547,157 B1
APPLICATION NO.    : 13/455998
DATED              : October 1, 2013
INVENTOR(S)        : Tobias Mangold et al.

It is certified that error appears in the above-identified patent and that said Letters Patent is hereby corrected as shown below:

In the Claims:

Col. 10, line 50 [Claim 18.] "…wherein RF transistor…" should read – "…wherein the RF transistor…"

Signed and Sealed this
Ninth Day of June, 2015

Michelle K. Lee
*Director of the United States Patent and Trademark Office*